(12) United States Patent
Huang

(10) Patent No.: US 7,965,096 B2
(45) Date of Patent: Jun. 21, 2011

(54) CIRCUIT AND METHOD FOR DETECTING FAULTY DIODE

(75) Inventor: Chi-Feng Huang, Hsinchu (TW)

(73) Assignee: ENE Technology Inc., Hsinchu (TW)

( * ) Notice: Subject to any disclaimer, the term of this patent is extended or adjusted under 35 U.S.C. 154(b) by 0 days.

(21) Appl. No.: 12/631,992

(22) Filed: Dec. 7, 2009

(65) Prior Publication Data
US 2010/0289518 A1   Nov. 18, 2010

(30) Foreign Application Priority Data

May 15, 2009  (TW) ............................... 98116229 A

(51) Int. Cl.
*G01R 31/26* (2006.01)

(52) U.S. Cl. .............................. 324/762.07; 324/762.01

(58) Field of Classification Search ............. 324/762.07, 324/763, 767
See application file for complete search history.

(56) References Cited

U.S. PATENT DOCUMENTS

| | | | |
|---|---|---|---|
| 5,438,607 A | 8/1995 | Przygoda, Jr. et al. | |
| 5,661,403 A | 8/1997 | Mackenzie | |
| 6,225,912 B1 * | 5/2001 | Tanaka et al. | 340/641 |
| 7,023,232 B2 * | 4/2006 | Yano et al. | 324/767 |
| 7,049,800 B2 * | 5/2006 | Huang et al. | 323/282 |
| 7,071,762 B2 * | 7/2006 | Xu et al. | 327/423 |
| 7,075,766 B2 * | 7/2006 | Moyer et al. | 361/93.1 |
| 7,259,525 B2 * | 8/2007 | Yang | 315/291 |
| 7,449,897 B2 * | 11/2008 | Moyer et al. | 324/713 |
| 7,626,340 B2 * | 12/2009 | Kang et al. | 315/209 R |
| 2008/0068298 A1 * | 3/2008 | Shen et al. | 345/46 |
| 2010/0220049 A1 * | 9/2010 | Murakami | 345/102 |
| 2010/0289519 A1 * | 11/2010 | Huang | 324/767 |

FOREIGN PATENT DOCUMENTS

TW    I299405    3/2006

* cited by examiner

*Primary Examiner* — Ha Tran T Nguyen
*Assistant Examiner* — Richard Isla Rodas
(74) *Attorney, Agent, or Firm* — WPAT, PC; Justin King

(57) ABSTRACT

A circuit for detecting faulty diode is disclosed, wherein the circuit for detecting faulty diode comprises a diode having an anode connecting to a voltage supply; a first switch having a first end connected to a cathode of the diode; a testing current source connected to the second end of the first switch; a one-shot circuit connected to a control end of the first switch, by which an output signal is generated and transmitted to the control end; and a comparator connected to a reference voltage input terminal for receiving a reference voltage and connected to the second end of the first switch. When the one-shot circuit closes the first switch for a maintaining period to urge the comparator comparing the reference voltage with the voltage applied to the second end of the first switch, whereby a signal used to discriminate whether the diode is fail or not is generated.

9 Claims, 3 Drawing Sheets

CIRCUIT AND METHOD FOR DETECTING FAULTY DIODE

FIELD OF THE INVENTION

The present invention relates to a detecting circuit and a detecting method, and more particularly to a circuit and a method for detecting faulty diodes.

BACKGROUND OF THE INVENTION

FIG. 1 illustrates a conventional circuit for detecting faulty diode disclosed in U.S. Pat. No. 6,225,912, issued in May 1, 2001. The circuit for detecting faulty diode is applied in a light-emitting diode (LED) array, which comprises a plurality of LEDs 1, a plurality of comparators 3 and a plurality of transistors 2. Wherein each of the LEDs 1 is associated with a transistor 2 and a comparator 3; each of the LEDs 1 has an anode electrically connected to a driving voltage supply terminal Va (+) and a cathode electrically connected to the negative terminal of the corresponding comparator 3 and the drain of the corresponding transistor 2; each positive terminal of the comparators 3 is connected to a reference voltage input terminal; each gate of the transistors 2 is connected to a turning-on signal input terminal; each source of the transistors 2 is connected to a driving voltage supply terminal Vb (−); and each comparator 3 has a output terminal connected to a faulty signal output terminal.

Assuming that a forward bias of the LED 1 is Vf, the comparators 3 corresponding to the reference voltage input terminal can receive a reference voltage. When the reference voltage is less than Va but greater than (Va−Vf), a process for detecting fault of short circuit can be conducted; otherwise, when the reference voltage is less than (Va−Vf), a process for detecting fault of open circuit can be conducted.

To the process for detecting fault of short circuit, for example, while the LED 1 is operated normally, the voltage applied to the negative terminal of the corresponding comparators 3 is (Va−Vf), and the reference voltage received by the positive terminal of the corresponding comparator 3 is in the range between Va and (Va−Vf). It means that, when the output of the faulty signal output terminal corresponding to the comparator 3 is maintained in a high level (H), which indicates that the LED 1 is operated in a normal situation. On the contrary, while the LED 1 is short, the voltage applied to the negative terminal of the corresponding comparator 3 is Va, and the reference voltage received by the positive terminal of the comparator 3 is less than Va. Thus, the output of the faulty signal output terminal corresponding to the comparator 3 is maintained in a low level (L), which indicates that the LED 1 that acts as a short circuit. That is to say, it can be discriminated that whether the LED 1 is operated in a normal situation or acts as a short circuit in accordance with the voltage level outputted by the faulty signal output terminal corresponding to the comparator 3.

The aforementioned circuit for detecting faulty diode was applied on an optical printer with a plurality of LEDs which functions by the control of either turning on or turning off the LEDs.

FIG. 2 illustrates another conventional circuit for detecting faulty diode disclosed in Taiwanese Patent No. 1299405, issued in Aug. 1, 2008 entitled as "Method and Apparatus for Silent Current Detection". The circuit for detecting faulty diode comprises a plurality of LEDs 10 connected in series (thereinafter is referred as LED series 10), comparator 30 and transistor 20. Wherein the anode of the LED series 10 is connected to a fixed voltage power supply $V_{LED}$; the source of the transistor 20 is grounded and the drain of the transistor 20 is connected to the cathode of the LED series 10; the positive terminal of the comparator 30 is applied with a reference voltage $V_{cc}$; the negative terminal of the comparator 30 is connected to the source of the transistor 20. In this example, the transistor 20 serves as a driving control circuit and the drain of the transistor 20 is the controlled-output of the driving control circuit.

Similar to FIG. 1, it can be discriminated that whether the LED series 10 is open or short, by the way of investigating the voltage applied to the positive and the negative terminal of the comparator 30.

However, hence the conventional circuit for detecting faulty diode only functions at the moment while the LED associated thereof is either turn on or turn off. Thus, it is not avoidable to prevent the users aware of the LEDs twinkling. Therefore it is not adequate to apply the conventional circuit for detecting faulty diode to a display screen with a plurality of LEDs, which requests the twinkle of the LEDs not being sensed by the users' eyes during operation.

SUMMARY OF THE INVENTION

The objects of the present invention are to provide a circuit and method for detecting faulty diode to detect faulty diodes not being sensed by the users' eyes.

One aspect of the present invention, a circuit for detecting faulty diode is disclosed, wherein the circuit for detecting faulty diode comprises a diode having an anode connecting to a voltage supply; a first switch having a first end connected to a cathode of the diode; a testing current source connected to the second end of the first switch; an one-shot circuit connected to a control end of the first switch, by which an output signal is generated and transmitted to the control end; and a comparator connected to a reference voltage input terminal for receiving a reference voltage and further connected to the second end of the first switch. When the one-shot circuit closes the first switch for a maintaining period to urge the comparator comparing the reference voltage with the voltage applied to the second end of the first switch, whereby a signal used to indicate whether the diode is fail or not is generated.

Another aspect of the present invention, a method for detecting faulty diode is disclosed, wherein the detecting method comprises steps as follows: when a detecting mode is adopted, a testing current source is switched to connect with a diode, so as to provide a testing current flowing through the diode. The existence of any faulty diode can be discriminated in accordance with a threshold voltage variation of the diode. When an operating mode is adopted, a control current source is switched to connect with the diode, so as to provide a control current flowing through the diode. After the detecting mode is hold for a maintaining period, the operating mode regains its dominance, wherein the maintaining period is less than 1 millisecond (ms).

To illustrate the make and use of the present invention, there provides several embodiments and the accompanying drawings. However, it must be appreciated that, the embodiments and drawings are illustrative but not intended to limit the scope of the present invention.

BRIEF DESCRIPTION OF THE DRAWINGS

The above objects and advantages of the present invention will become more readily apparent to those ordinarily skilled in the art after reviewing the following detailed description and the accompanying drawings, in which.

DETAILED DESCRIPTION OF PREFERRED EMBODIMENTS

Figure 1:
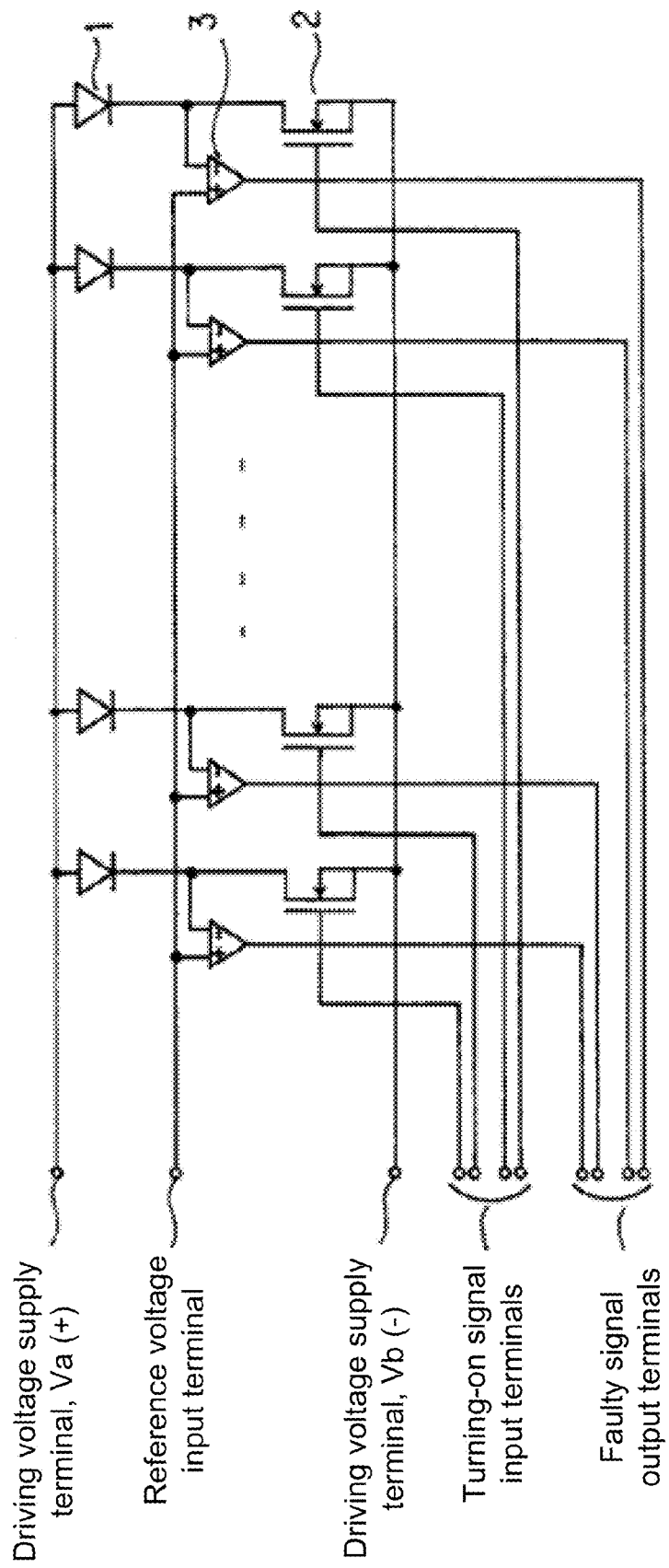
FIG. 1 illustrates a conventional circuit for detecting faulty diode in accordance with the prior art.
Figure 2:
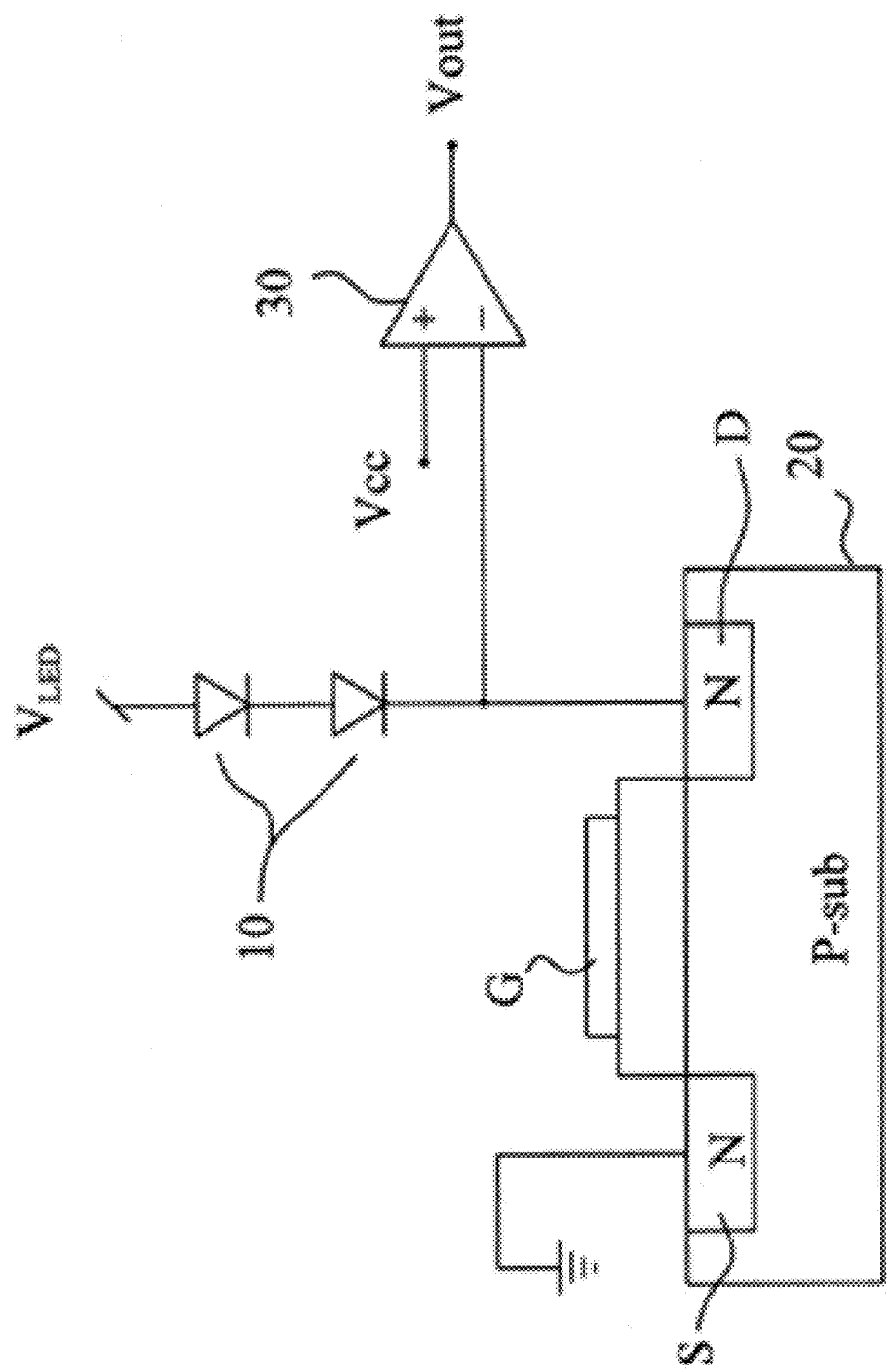
FIG. 2 illustrates another conventional circuit for detecting faulty diode in accordance with the prior art.
Figure 3:
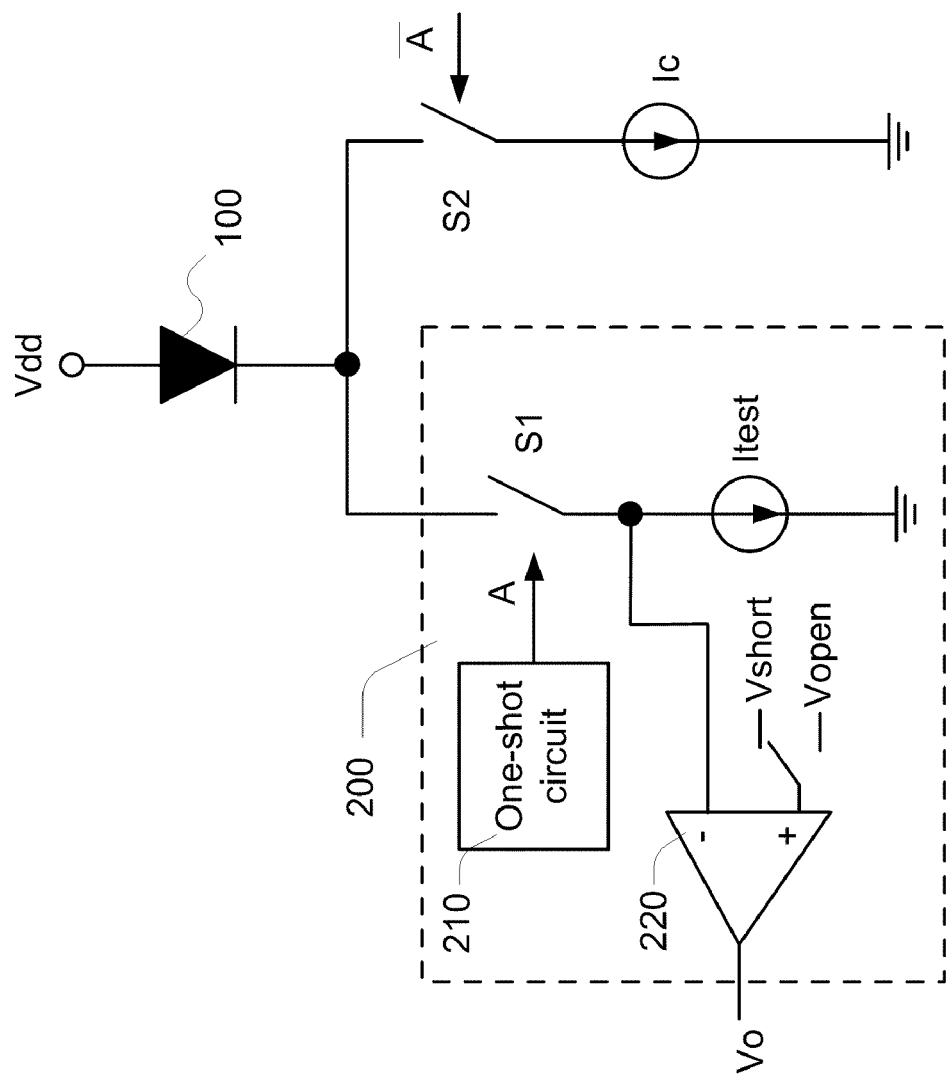
FIG. 3 illustrates a LED display associated with a circuit for detecting faulty diode in accordance with one embodiment of the present invention.

FIG. 3 illustrates a LED display associated with a circuit for detecting faulty diode in accordance with one embodiment of the present invention. In FIG. 3 a single LED 100 is illustrated to represent the LED display, wherein the anode of the LED 100 is connected to a voltage supply $V_{dd}$, the cathode of the LED 100 is connected to a control current source Ic via a second switch S2, and the cathode of the LED 100 is further connected to a circuit for detecting faulty diode 200. It must be appreciated that in FIG. 3 although the LED display is merely represented by a single LED 100, however, in other embodiments the LED display may further include other LEDs embodying the same features to complement the present invention.

The circuit for detecting faulty diode 200 comprises a first switch S1, an one-shot circuit 210, a comparator 220 and a testing current source $I_{test}$. The first switch S1 has a first end, a second end and a control end, wherein the first end is connected to the cathode of the LED 100, the second end is connected to the testing current source $I_{test}$ and the control end is connected to the one-shot circuit 210. Furthermore, the negative terminal of the comparator 220 is connected to the second end of the first switch 51, and the positive terminal of the comparators 220 is selectively either connected to a short-testing terminal for receiving a short-testing voltage $V_{short}$ or connected to an open-testing terminal for receiving an open-testing voltage $V_{open}$.

In according to some embodiments of the present invention, the one-shot circuit 210 is a mono stable circuit. When an operating mode is adopted, a signal (A) outputted by the one-shot circuit 210 is maintained in a first level (e.g. to be maintained in a low level); otherwise when a detecting mode is adopted, the signal (A) outputted by the one-shot circuit 210 is maintained in a second level (e.g. to be maintained in a high level). Wherein after the signal (A) outputted by the one-shot circuit 210 is maintained in the second level and hold for a maintaining period, the level of the signal (A) can be returned to the first level. It means that the detection of faulty diodes (which applying the circuit for detecting faulty diode 200) only performs in the period (the maintaining period) when the detecting mode is adopted. After that, the operating mode regains the dominance by which the LED 100 is controlled by the control current source $I_c$. In some preferred embodiments, the maintaining period is less than 1 millisecond (ms).

On the other words, when the signal (A) outputted by the one-shot circuit 210 is maintained in a first level, the second switch S2 is closed and the first switch 51 is opened. While the control current source $I_c$ can be controlled to change current flowing through the LED 100, whereby the LED 100 can generate light with different intensity by the various current.

Furthermore, when the signal (A) outputted by the one-shot circuit 210 is maintained in a second level, the second switch S2 is opened and the first switch S1 is closed. While the current provided by the testing current source $T_{test}$ flows through the LED 100, and it can be discriminated whether the diode is fail or not in accordance with the signal $V_o$ generated by comparator 220.

In some embodiments of the present invention, the voltage provided by the voltage supply $V_{dd}$ is 5V, the forward bias of the LED 100 is 3.5V, the short-testing voltage $V_{short}$ applied to the short-testing voltage terminal is 4 V, and the open-testing voltage $V_{open}$ applied to the open-testing voltage terminal is 1 V. And when the detecting mode is adopted, the total time of the short-testing period and the open-testing period should be less than the maintaining period of the one-shot circuit 210.

For further details, during the short-testing period, the positive terminal of the comparator 220 is selected to connect to the short-testing terminal to receive the short-testing voltage $V_{short}$. When the LED 100 is operated in a normal situation, the voltage applied on the negative terminal of the comparator 202 is 1.5V(5V−3.5V=1.5V). It is to say, when the signal $V_o$ outputted by the comparator 202 is maintained in a high level, it indicates that the LED 100 is operated in a normal situation. On the contrary, when the LED 100 is short, the voltage applied on the negative terminal of the comparator 202 is 5V. Thus when the signal $V_o$ outputted by the comparator 202 is maintained in a low level, it indicates that the LED 100 has a fault of short circuit.

During the open-testing period, the positive terminal of the comparator 220 is selected to connect to the open-testing terminal to receive the open-testing voltage $V_{open}$. When the LED 100 is operated in a normal situation, the voltage applied on the negative terminal of the comparator 202 is 1.5V(5V−3.5V=1.5V). It is to say when the signal $V_o$ outputted by the comparator 202 is maintained in a low level, it indicates that the LED 100 is operated in a normal situation. On the contrary, when the LED 100 is open, and the voltage applied on the negative terminal of the comparator 202 is 0V. Thus when the signal $V_o$ outputted by the comparator 202 is maintained in a high level, it indicates that the LED 100 has a fault of open circuit.

In practice, hence the minimal time for the human eyes to sense rapid light changes is about 3 to 10 milliseconds that is much longer than the maintaining period of the detecting mode. Therefore the present process for detecting faulty diodes can be completed not being sensed by the human's eyes. It means that under the human's viewpoint the visual image of the LED display can appear in a constant situation without twinkling, even when the circuit for detecting faulty diode is operating.

As is understood by a person skilled in the art, it is intended to cover various modifications and similar arrangements included within the spirit and scope of the appended claims, the scope of which should be accorded the broadest interpretation so as to encompass all such modifications and similar structure.

What is claimed is:

1. A circuit for detecting a faulty diode comprising:
   a diode, having an anode connected to a voltage supply;
   a first switch, having a first end connected to a cathode of the diode;
   a testing current source, connected to a second end of the first switch;
   an one-shot circuit, used to generated and transmit an output signal to a control end of the first switch; and
   a comparator, having two ends respectively connected to a reference voltage input terminal for receiving a reference voltage and connected to the second end of the first switch;

a second switch, having a first end connected to the cathode of the diode; and a control current source, connected to a second end of the second switch;

wherein when the one-shot circuit closes the first switch for a maintaining period to urge the comparator to compare the reference voltage with the voltage applied to the second end of the first switch, whereby a signal used to discriminate whether the diode is fail or not is generated and after the one-shot circuit closes the first switch for the maintaining period, the second switch is closed and the first switch is opened, whereby the control current source controls the diode.

2. The circuit for detecting a faulty diode according to claim 1, wherein the diode is a light emitting diode (LED).

3. The circuit for detecting a faulty diode according to claim 1, wherein the maintaining period is less than 1 millisecond (ms).

4. The circuit for detecting a faulty diode according to claim 1, wherein the reference voltage applied to the reference voltage input terminal is an open-testing voltage or a short-testing voltage.

5. The circuit for detecting a faulty diode according to claim 4, wherein the maintaining period further comprises a short-testing period and an open-testing period; wherein during the short-testing period the short-testing voltage is applied as the reference voltage; and during the open-testing period the open-testing voltage is applied as the reference voltage.

6. A method for detecting a faulty diode comprising:

adopting a dominant operating mode to switch a control current source connected with a diode, so as to provide a control current flow through the diode;

stopping the operating mode and adopting a detecting mode to switch a testing current source connected to the diode, so as to provide a test current flow through the diode, thereby identifying whether the diode is faulty or operational in accordance with a bias voltage of the diode;

wherein after the detecting mode is held for a maintaining period, the detecting mode stops and the operating mode regains its dominance, and the maintaining period is less than 1 ms and is determined by a one-shot circuit.

7. The method for detecting a faulty diode according to claim 6, wherein the maintaining period further comprises a short-testing period and an open-testing period.

8. The method for detecting a faulty diode according to claim 6, wherein the diode is a LED.

9. The method for detecting a faulty diode according to claim 8, wherein when the control current flows through the LED, the LED can generate a light signal.

* * * * *